United States Patent
So et al.

(10) Patent No.: US 9,214,503 B2
(45) Date of Patent: Dec. 15, 2015

(54) ORGANIC LIGHT EMITTING DISPLAY PANEL INCLUDING A PROTECTIVE SPACER AND METHOD OF MANUFACTURING THE SAME

(71) Applicant: SAMSUNG DISPLAY CO., LTD., Yongin, Gyeonggi-Do (KR)

(72) Inventors: Dong-Yoon So, Asan-si (KR); Tae-Gon Kim, Cheonan-si (KR); Yong-Chul Kim, Seoul (KR); Ji-Yong Park, Yongin-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/456,169

(22) Filed: Aug. 11, 2014

(65) Prior Publication Data
US 2015/0041796 A1 Feb. 12, 2015

(30) Foreign Application Priority Data
Aug. 12, 2013 (KR) ........................ 10-2013-0095137

(51) Int. Cl.
*H01L 51/50* (2006.01)
*H01L 27/32* (2006.01)

(52) U.S. Cl.
CPC ........ *H01L 27/3246* (2013.01); *H01L 27/3258* (2013.01); *H01L 2227/323* (2013.01)

(58) Field of Classification Search
CPC ..... H01L 51/0018; H01L 51/50; H01L 51/52; H01L 51/56
USPC ..................... 257/40, 59, 72, E27.119, 51.018
See application file for complete search history.

(56) References Cited

U.S. PATENT DOCUMENTS

| | | | |
|---|---|---|---|
| 2007/0108889 A1 | 5/2007 | Kim | |
| 2009/0189517 A1 | 7/2009 | Choi et al. | |
| 2010/0171419 A1 | 7/2010 | Kim et al. | |
| 2011/0221334 A1 | 9/2011 | Kwon et al. | |
| 2011/0227078 A1* | 9/2011 | Park et al. | 257/59 |
| 2012/0326603 A1* | 12/2012 | Kim | 313/512 |
| 2013/0001533 A1 | 1/2013 | Kim et al. | |
| 2013/0187167 A1* | 7/2013 | Jin et al. | 257/72 |
| 2014/0070175 A1* | 3/2014 | Kang | 257/40 |

(Continued)

FOREIGN PATENT DOCUMENTS

| | | |
|---|---|---|
| KR | 10-2007-0052151 A | 5/2007 |
| KR | 10-0889682 B1 | 3/2009 |
| KR | 10-2010-0081771 A | 7/2010 |

(Continued)

*Primary Examiner* — Michael Lebentritt
(74) *Attorney, Agent, or Firm* — Lee & Morse, P.C.

(57) ABSTRACT

An organic light emitting display panel may include a plurality of thin film transistors on a substrate, an insulating interlayer on the thin film transistors, a plurality of first electrodes on a portion of the insulating interlayer electrically connected to the thin film transistors, a plurality of metal lines on a portion of the insulating interlayer, a pixel defining layer on a portion of the insulating interlayer and a portion of the first electrodes, a plurality of organic light emitting structures on the first electrodes in the pixel area, a second electrode on the organic light emitting structures, and a spacer on the pixel defining layer. The insulation interlayer may partially expose electrodes of the thin film transistors. The pixel defining layer may define a pixel area by partially exposing the first electrodes, and an exposed area of the insulating interlayer by partially exposing the insulating interlayer.

9 Claims, 10 Drawing Sheets

(56) References Cited

U.S. PATENT DOCUMENTS

2014/0197385 A1* 7/2014 Madigan .................... 257/40
2015/0090982 A1* 4/2015 Lin et al. .................... 257/40

FOREIGN PATENT DOCUMENTS

| KR | 10-2011-0101760 A | 9/2011 |
| KR | 10-2013-0007006 A | 1/2013 |

\* cited by examiner

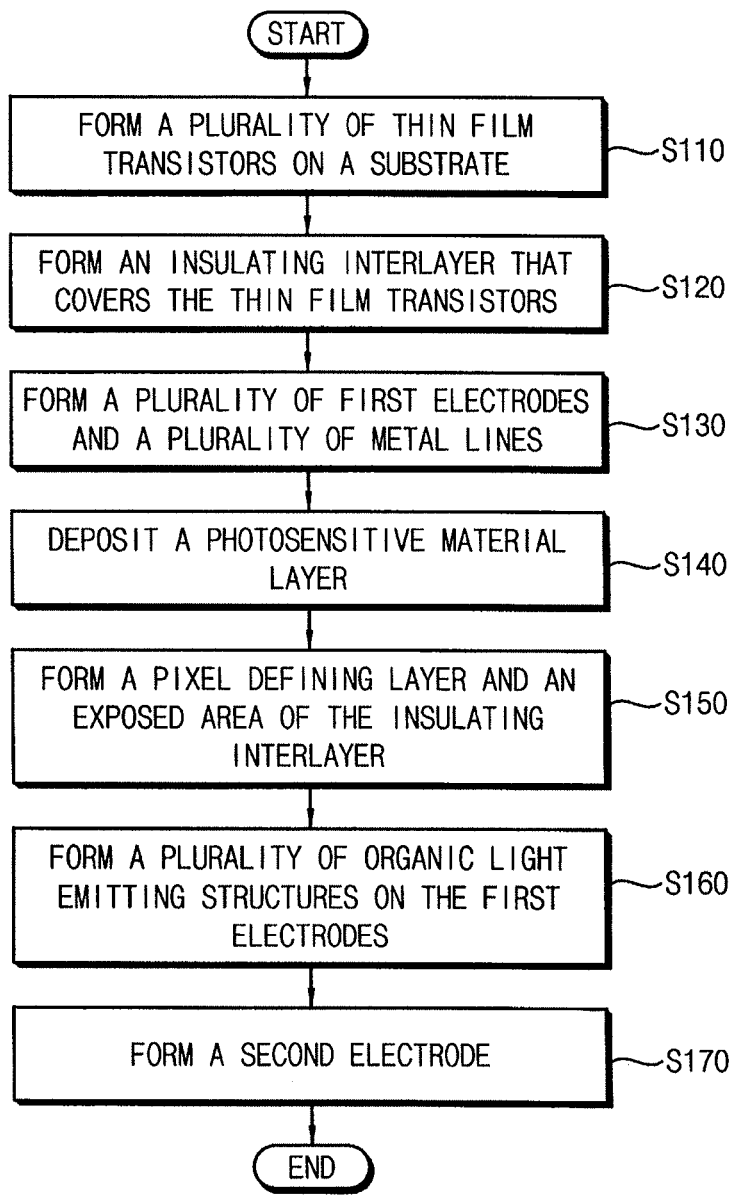

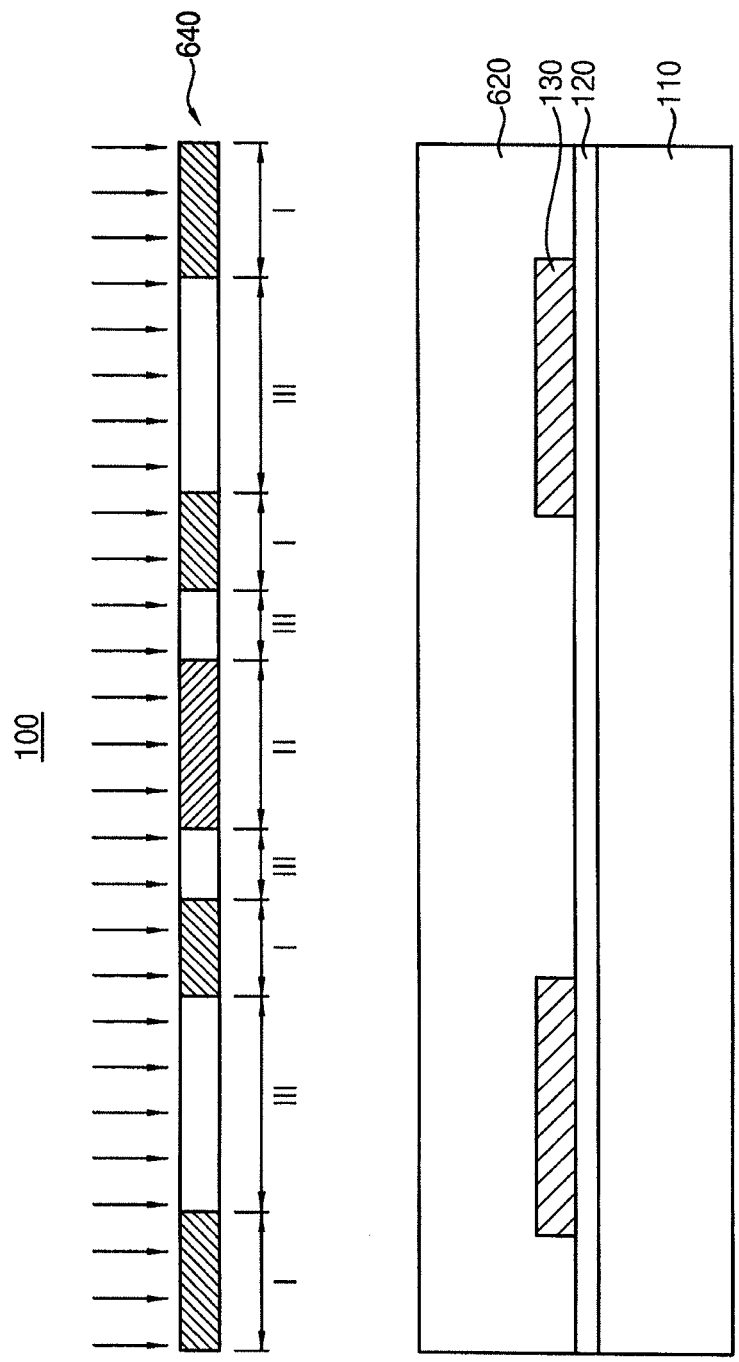

ORGANIC LIGHT EMITTING DISPLAY PANEL INCLUDING A PROTECTIVE SPACER AND METHOD OF MANUFACTURING THE SAME

CROSS-REFERENCE TO RELATED APPLICATION

The present application claims priority under 35 U.S.C. §119 to Korean Patent Application No. 10-2013-0095137, filed on Aug. 12, 2013, in the Korean Intellectual Property Office, and entitled: "Organic Light Emitting Display Panel and Method Of Manufacturing The Same," which is incorporated by reference herein in its entirety.

BACKGROUND

1. Field

The disclosure relates to organic light emitting display devices. More particularly, the disclosure relates to organic light emitting display panel including spacers, and methods of manufacturing the same.

2. Description of the Related Art

An organic light emitting display (OLED) device may display desired information such as images, letters, and/or characters using light generated by combinations of holes provided from an anode and electrons provided from a cathode in an organic light emitting layer. The OLED device may have several advantages such as wide viewing angle, high response time, thinness, and low power consumption. Thus, the OLED device may be widely employed in various electrical and electronic devices. The OLED device has rapidly developed as one of the most promising display devices.

SUMMARY

Embodiments are directed to an organic light emitting display panel including a plurality of thin film transistors on a substrate, an insulating interlayer on the thin film transistors, a plurality of first electrodes on a portion of the insulating interlayer, a plurality of metal lines on a portion of the insulating interlayer, a pixel defining layer on a portion of the insulating interlayer and a portion of the first electrodes, a plurality of organic light emitting structures, a second electrode on the organic light emitting structures; and a spacer on the pixel defining layer. The insulation interlayer may partially expose electrodes of the thin film transistors. The first electrodes may be electrically connected to the thin film transistors. The pixel defining layer may define a pixel area by partially exposing the first electrodes, the pixel defining layer defining an exposed area of the insulating interlayer by partially exposing the insulating interlayer. The plurality of organic light emitting structures may be on the first electrodes in the pixel area.

The exposed area of the insulating interlayer, the pixel defining layer, and the spacer may be the result of a simultaneous formation using a halftone mask. The pixel defining layer and the spacer may include an identical material. The pixel defining layer and the spacer may include a photosensitive material. The halftone mask may include a transmissive region, a blocking region, and semi-transmissive regions. The photosensitive material may be formed using a positive photosensitive material. The semi-transmissive regions may correspond to the pixel defining layer. The light blocking region may correspond to the spacer. The transmissive region may correspond to the exposed first electrodes and the exposed area of the insulating interlayer. The photosensitive material may be formed using a negative photosensitive material. The semi-transmissive regions may correspond to the pixel defining layer. The transmissive region may correspond to the spacer. The light blocking region may correspond to the exposed first electrodes and the exposed area of the insulating interlayer.

The spacer may be on the pixel defining layer, the pixel defining layer being patterned over the metal lines and the exposed area of the insulating interlayer by a slit mask. The exposed area of the insulating interlayer may be between the first electrodes. The spacer may be on the exposed area of the insulating interlayer in an island shape.

Embodiments are also directed to a method of manufacturing an organic light emitting display panel. The method may include the following. Forming a plurality of thin film transistors on a substrate. Forming an insulating interlayer on the substrate to cover the thin film transistors. Forming a plurality of first electrodes and a plurality of metal lines on the insulating interlayer. Depositing a photosensitive material layer on the first electrodes, the metal lines, and the insulating interlayer. Forming a pixel defining layer on a portion of the insulation interlayer, the pixel defining layer exposing the first electrodes, and forming an exposed area of the insulating interlayer by patterning the photosensitive material layer using a mask. Forming a plurality of organic light emitting structures on the first electrodes that are exposed by the patterning. Forming a second electrode on the pixel defining layer, the exposed area of the insulating interlayer, and the organic light emitting structures. A spacer may be formed on the pixel defining layer.

Forming the pixel defining layer may include patterning the photosensitive material layer by exposing the photosensitive material layer using a halftone mask. The exposed area of the insulating interlayer, the pixel defining layer, and the spacer may be simultaneously formed by the halftone mask. The halftone mask may include a transmissive region, a light blocking region, and semi-transmissive regions.

The photosensitive material layer may be formed using a positive photosensitive material. The semi-transmissive regions may correspond to the pixel defining layer. The light blocking region may correspond to the spacer. The transmissive region may correspond to the exposed first electrodes and the exposed area of the insulating interlayer.

The photosensitive material may be formed using a negative photosensitive material, and the semi-transmissive regions may correspond to the pixel defining layer. The transmissive region may correspond to the spacer. The light blocking region may correspond to the exposed first electrodes and the exposed area of the insulating interlayer.

The exposed area of the insulating interlayer may be formed between the metal lines and the first electrodes. The pixel defining layer may be formed on at least one of the metal lines by using a slit mask. The spacer may be disposed over the pixel defining layer that is patterned by the slit mask and the exposed area of the insulating interlayer. The exposed area of the insulating interlayer may be between the first electrodes. The spacer may be on the exposed area of the insulating interlayer in an island shape.

BRIEF DESCRIPTION OF THE DRAWINGS

Features will become apparent to those of skill in the art by describing in detail exemplary embodiments with reference to the attached drawings in which:

FIG. 5 is a flow chart of a method of manufacturing an organic light emitting display panel according to the present disclosure.

FIGS. 6A through 6E illustrate cross-sectional views of the method of FIG. 5.

DETAILED DESCRIPTION

Figure 1:
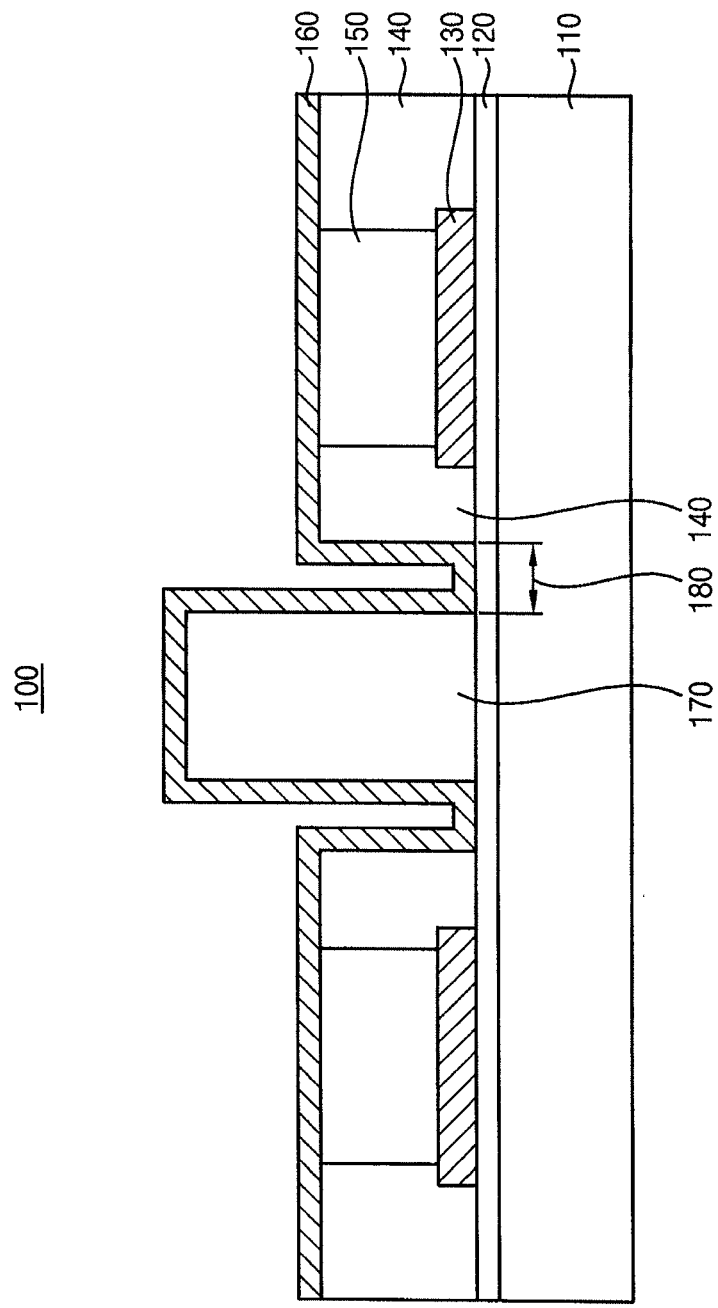
FIG. 1 illustrates a cross-sectional view of an organic light emitting display panel according to the present disclosure.

Example embodiments will now be described more fully hereinafter with reference to the accompanying drawings; however, they may be embodied in different forms and should not be construed as limited to the embodiments set forth herein. In the drawing figures, the dimensions of layers and regions may be exaggerated for clarity of illustration. When an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout.

The term "and/or" includes any and all combinations of one or more of the associated listed items. It will be understood that, although the terms first, second, third, and the like may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section could be termed a second element, component, region, layer or section without departing from the present disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view illustrating an organic light emitting display panel according to the present disclosure. The organic light emitting display panel 100 may include a substrate 110, an insulating interlayer 120, first electrodes 130, a pixel defining layer (PDL) 140, an organic light emitting structure 150, a second electrode 160, and a spacer 170. The organic light emitting display panel 100 may further include a plurality of thin-film transistors (TFTs) on the substrate 110, a protection layer, and an encapsulation substrate on the second electrode 160.

The substrate 110 may include a transparent substrate such as a glass substrate, a quartz substrate, a transparent ceramic substrate, a transparent plastic substrate, or the like. Examples of the transparent plastic substrate may include polyimide, acryl, polyethylene terephthalate (PET), polycarbonate, polyacrylate, polyether, and the like. The substrate 110 may be a flexible substrate. A buffer layer may be on the substrate 110. The buffer layer may prevent diffusion of impurities from the substrate 110, and may adjust a heat transfer rate in a crystallization process for forming a semiconductor pattern. The buffer layer may include a silicon compound, such as, for example, silicon oxide ($SiO_x$), silicon nitride ($SiN_x$), silicon oxynitride ($SiO_xN_y$), or the like. The buffer layer may have a single-layered structure or a multi-layered structure including at least one silicon compound film.

The thin film transistors may be provided on the substrate 110. Each of the thin film transistors may include the semiconductor pattern, a gate insulation layer, a gate electrode, a source electrode, and a drain electrode. The thin film transistors may include a switching transistor and a driving transistor that are provided on the substrate 110. The switching transistor may transfer data signals input from data lines. The driving transistor may receive the data signals through the switching transistor, and may control a current flowing through the light emitting structure 150. At least one insulating interlayer 120 may be formed between the switching transistor and the first electrode 130. The insulating interlayer 120 may include organic materials. For example, the insulating interlayer 120 may include photoresist, acryl-based resin, polyimide-based resin, polyamide-based resin, siloxane-based resin, novolak resin, alkali-soluble resin, benzocyclobutene (BCB), or the like. These may be used alone or in a combination thereof. At least one insulating interlayer 120 may include an inorganic material, such as silicon compound, metal, metallic oxide, or the like. For example, the insulating interlayer 120 may include silicon oxide, silicon nitride, silicon oxynitride, silicon oxycarbide ($SiO_xC_y$), aluminum (Al), zinc (Zn), hafnium (Hf), zirconium (Zr), titanium (Ti), tantalum (Ta), aluminum oxide (AlOx), titanium oxide ($TiO_x$), tantalum oxide ($TaO_x$), magnesium oxide ($MgO_x$), zinc oxide (ZnO$_x$), hafnium oxide (HfO$_x$), zirconium oxide (ZrO$_x$), titanium oxide (TiO$_x$), or the like. These may be used alone or in a combination thereof.

The first electrode 130 and a plurality of metal lines may be formed on the insulating interlayer 120, respectively. The first electrode 130 may be electrically connected to the drain electrode of the thin film transistor. The first electrode 130 may include a transparent conductive material, metal, and/or alloy. For example, the first electrode 130 may include indium tin oxide (ITO), zinc tin oxide (ZTO), indium zinc oxide (IZO), zinc oxide (ZnO$_x$), gallium oxide (GaO$_x$), tin oxide (SnO$_x$), silver (Ag), aluminum (Al), platinum (Pt), gold (Au), chrome (Cr), tungsten (W), molybdenum (Mo), titanium (Ti), palladium (Pd), iridium (Ir), or the like.

The pixel defining layer 140, an exposed area 180 of the insulating interlayer 120, and the spacer 170 may be formed by patterning a photosensitive material layer using a mask, after the photosensitive material layer is deposited on the first electrode 130 and the insulating interlayer 120 overall. The pixel defining layer 140 may be formed on a portion of the insulating interlayer 120 and on a portion of the first electrode 130. The pixel defining layer 140 may define a red pixel region, a green pixel region, and a blue pixel region of the organic light emitting display device. Portions of the first electrodes exposed by the pixel defining layer 140 may correspond to the red pixel region, the green pixel region, and the blue pixel region, respectively. The pixel defining layer 140 may include an organic material, such as, for example, polyacryl-based resin, epoxy-based resin, phenol-based resin, polyamide-based resin, polyimide-based resin, unsaturated polyester-based resin, polyphenylene-based resin, poly(phenylenesulfide)-based resin, benzocyclobutene (BCB), or the like. The pixel defining layer 190 may include an inorganic material such as silicon oxide, silicon nitride, silicon oxynitride, or the like.

The exposed area 180 of the insulating interlayer 120, the pixel defining layer 140, and the spacer 170 may be simultaneously formed by a halftone mask. The pixel defining layer 140 and the spacer 170 may include an identical material. For example, the pixel defining layer 140 and the spacer 170 may include a resin, such as polyacrylates resin, polyimide, or the like, or an inorganic material, such as silica-based materials, or the like. The halftone mask may include a transmissive region, a light blocking region, and semi-transmissive (i.e., translucence) regions. Thus, exposed regions of the photosensitive material layer may be removed in a developing process, and unexposed regions of the photosensitive material layer may be remained in the developing process.

When, for example, the photosensitive material layer is formed by using a positive photosensitive material, the semi-transmissive regions may correspond to the pixel defining layer 140, the light blocking region may correspond to the spacer 170, and the transmissive region may correspond to the exposed first electrodes 130 and the exposed area 180 of the insulating interlayer 120. When, for example, the photosensitive material layer is formed by using a negative photosensitive material, the semi-transmissive regions may correspond to the pixel defining layer 140, the transmissive region may correspond to the spacer 170, and the light blocking region may correspond to the exposed first electrodes 130 and the exposed area 180 of the insulating interlayer 120. The pixel defining layer 140 and the spacer 170 may be provided in other ways. The pixel defining layer 140 and the spacer 170 may be formed by different materials, and may be formed by different process, respectively.

The spacer 170 may be formed on the pixel defining layer 140 or the exposed area 180 of the insulating interlayer 120. The spacer may be formed on the insulating layer 120. An upper face of the spacer 170 may have a height substantially higher than a height of an upper face of the pixel defining layer 140. When, for example, the spacer 170 protrudes over the upper face of the pixel defining layer 140, the spacer 170 may ensure a predetermined gap between the substrate 110 and the encapsulation substrate that is combined with the substrate 110. Even when pressure or stress is applied to the encapsulation substrate, the organic light emitting display panel 100 need not be damaged due to the spacer 170, which ensures improved structural stability of the organic light emitting display panel 100. The spacer 170 may include polyacryl-based resin, epoxy-based resin, phenol-based resin, polyamide-based resin, polyimide-based resin, unsaturated polyester-based resin, polyphenylene-based resin, polyphenylenesulfide-based resin, benzocyclobutene, or the like.

After forming the pixel defining layer and the spacer by mask process, or forming the organic light emitting structure, a curing process (i.e., a baking process) may be performed for the organic light emitting display panel to harden an insulation material or an organic material. As the spacer is exposed to high temperature in a certain time, the spacer may collapse, and may flow onto the upper face of the pixel defining layer and a pixel region. The exposed area 180 of the insulating interlayer 120 may be between the first electrodes, and the spacer 170 may be on the exposed area 180 of the insulating interlayer 120 in an island shape. Thus, a side of the neighboring pixel defining layer 140 may act as a wall. Thus, the side of the neighboring pixel defining layer 140 may prevent the spacer 170 from flowing onto the pixel region. As a result, a certain level of height and area of the spacer (or, a predetermined level) may be maintained.

The exposed area of the insulating interlayer 180 may be formed to be separate from the first electrodes 130 and the metal lines. For example, the exposed area 180 of the insulating interlayer 120 may be formed between the first electrodes 130. When the metal lines and/or the first electrode that does not correspond to the pixel region are exposed by the mask process, the organic light emitting structures and/or the second electrode may directly contact the metal lines and/or the first electrode in following processes. In this case, unintended defects may occur. To help prevent the defects, the exposed area 180 of the insulating interlayer 120 may be formed to be separate from the first electrode and the metal lines. Thus, a remaining portion of a pixel defining layer may be formed on a metal-line region by using a slit mask to cover the metal lines. The remaining portion of the pixel defining layer on the metal-line region may have a height lower than the pixel defining layer 140 on the portion of the first electrode 130. The spacer may be on a region that is not used for the spacers in a comparative organic light emitting display panel. Accordingly, the spacer may be formed over the remaining portion of the pixel defining layer and the exposed area of the insulating interlayer that is formed to be separate from the first electrode and the metal lines. Therefore, the spacer may be formed on the metal lines so that an area ratio of spacer to a unit pixel may be increased. Further, sufficient height of the spacer may be secured in view of the spacer being on the insulating interlayer.

The organic light emitting structures 150 may be formed on the first electrodes 130 that are exposed by the pixel defining layer 140. Each of the light emitting structures 150 may include a hole injection layer (HIL), a hole transporting layer (HTL), an emission layer (EL), an electron transporting layer (ETL), an electron injection layer (EIL), or the like. The organic light emitting structure 150 positioned on the first electrode 130 in the red pixel region may include a red emission layer for generating a red color light, and the organic light emitting structure 150 positioned on the first electrode 130 in the green pixel region may include a green emission layer for generating a green color light. Further, the organic light emitting structure 150 positioned on the first electrode 130 in the blue pixel region may include a blue emission layer for generating a blue color light.

In the organic light emitting structure 150, the hole injection layer may include an arylamine-based compound, a phthalocyanine compound, a starburst-based amine compound, or the like. For example, the hole injection layer may include 4,4,4-tris(3-methylphenyleamino)triphenylamino (m-MTDATA), copper phthalocyanine (CuPC), 1,3,5-tris[4-(3-methylphenylamino)phenyl]benzene (m-MTDATB), or the like. The hole transporting layer may include arylenediamine derivatives, a starburst-type compound, biphenyl-diamine derivatives having a spiro-group, or a ladder-type compound. For example, the hole transporting layer may include N,N'-diphenyl-N,N'-bis(3-methylphenyl)-1,1'-biphenyl-4,4'diamine (TPD), N,N'-di(naphthalene-1-il)-N,N'-diphenyl benzidine (α-NPD), 4,4'-bis(1-naphthylphenylamino)biphenyl (NPB), or the like.

The emission layer may include a host-type emission layer and dopant material doped in the host-type emission layer. For example, the host-type emission layer may include 4,4-N,N'-dicarbazole-biphenyl (CBP), bis(2-methyl-8-quinolinolato)-(4-phenylphenolato)aluminium (BAlq), 2,9-dimethyl-4,7-diphenyl-1,10-phenanthroline (BCP), N,N'-dicarbazolyl-1,4-dimethene-benzene (DCB), rubrene, distyryl arylene derivatives (DSA), oxydiazole derivatives, anthracene derivatives, or the like. When, for example, the dopant material includes fluorescent dopants, the dopant material may include distyrylamine derivatives, pyrene derivatives, perylene derivatives, distyrylbiphenyl (DSBP) derivatives, 10-(2-benzothia-zolyl)-2,3,6,7-tetrahydro-1,1,7,7,-tetramethyl 1-1H,5H,11H-[1]benzopyrano[6,7,8-ij]quinolizin-11-one (C545T), quinacridone derivatives, 4-(dicyano-methylene)-2-t-butyl-6-(1,1,7,7-tetramethyl-julolidyl-9-enyl)-4H-pyran (DCJTB), 4-dicyano-methylene-2-methyl-6-p-dimethyl amino-styrl-4H-pyran (DCM), or the like. When, for example, the dopant material includes phosphorescent dopants, the dopant material may include bis(3, 5-difluoro-2-(2-pyridyl)phenyl-(2-carboxypyridyl)iridium (F2Irpic), PQIr, (F2ppy)2Ir(tmd), Ir(piq)2(acac), tris(2-phenylpiridine)iridium(III) (Ir(PPy)3), Btp2Ir(acac), 2,3,7,8,12, 13,17,18-Octaethyl-21H,23H-porphine,platinum(II) (PtOEP), or the like. The electron transporting layer may include TAZ, PBD, spiro-PBD, Alq3, BAlq, SAlq, and the electron injection layer may include LiF, Ga complex, Liq, CsF, or the like.

The second electrode 160 may be formed on the pixel defining layer 140 and the organic light emitting structures 150. The second electrode 160 may include a transparent conductive material. For example, the second electrode 160 may include indium tin oxide, indium zinc oxide, zinc indium oxide, zinc oxide, tin oxide, gallium oxide, or the like. These may be used alone or in a combination thereof. The second electrode 160 may extend from the red pixel region, the green pixel region, and the blue pixel region to the isolation pattern. For example, the second electrode 160 may be located on only the red, the green and the blue pixel regions. The second electrode 160 may be on the organic light emitting structures 150 and portions of the pixel defining layer 140 (such as, for example, sidewalls of the pixel defining layer 140). Further, an upper face of the second electrode 160 may be substantially lower than the upper face of the spacer 170.

A protection layer may be on the second electrode 160. Further, the encapsulation substrate may be on the protection layer and the spacer 170. The encapsulation substrate may be combined with the substrate 110. The spacer 170 may protrude over the second electrode 160 between the substrate 110 and the encapsulation substrate. The organic light emitting display panel may further include a storage capacitor that is provided on the substrate 110. The storage capacitor may provide the thin film transistors with predetermined currents when the switching transistor turns off.

The organic light emitting display panel 100 may include the spacer 170 on the exposed area 180 of the insulating interlayer 120, the spacer 170 and the exposed area 180 of the insulating interlayer 120 being formed by the halftone mask. The spacer 170 need not flow onto an upper face of the pixel defining layer 140, and need not collapse in a curing process (or, a baking process), so that sufficient height and area of the spacer 170 may be secured (e.g., a certain level of height and area of the spacer 170 may be maintained). The spacer 170 may ensure a predetermined gap between the substrate 110 and the encapsulation substrate that is combined with the substrate. Even when pressure or stress is applied to the encapsulation substrate, the organic light emitting display panel 100 need not be damaged due to the spacer 170, which ensures improved structural stability of the organic light emitting display panel 100.

Figure 2:
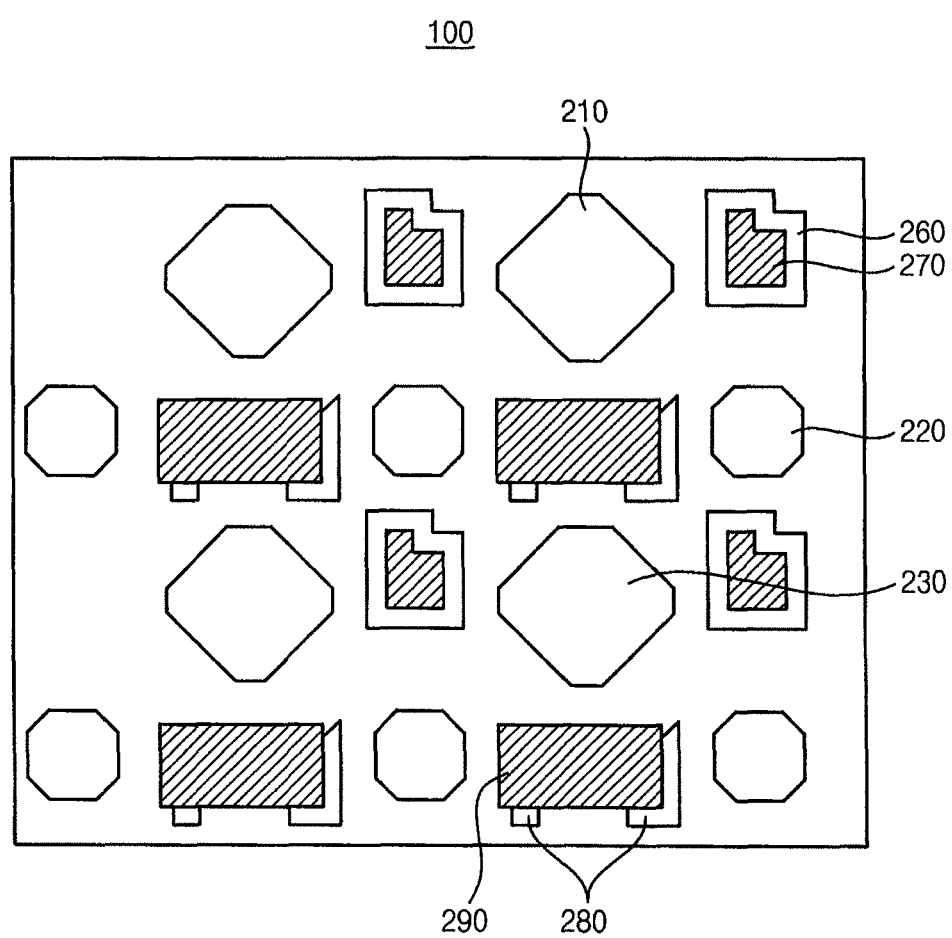
FIG. 2 illustrates a plan view of an example of the organic light emitting display panel of FIG. 1.

FIG. 2 illustrates a plan view illustrating an example of the organic light emitting display panel of FIG. 1. The organic light emitting display panel 100 may include pixel regions 210, 220, and 230, a pixel defining layer, exposed areas of an insulating layer 260 and 280, and spacers 270 and 290. Respective pixel regions 210, 220, and 230 that are located close to each other may include respective organic light emitting structures that emit different color lights, so that the organic light emitting display panel 100 may realize a full-color display. For example, the pixel region 210 may emit a red color light, the pixel region 220 may emit a green color light, and the pixel region 230 may emit a blue color light. However, colors of lights emitted by the pixel regions 210, 220, and 230 are not limited thereto. The pixel defining layer may define the pixel regions 210, 220, and 230 and non-pixel regions. Therefore, regions in which the pixel defining layer is disposed need not emit lights. The pixel defining layer, the exposed area of the insulating interlayer 260 and 280, and the spacer 270 and 290 may be simultaneously formed by a halftone mask or a slit mask.

The exposed area of the insulating interlayer 260 may be separately located from first electrodes included in the pixel regions 210, 220, and 230, and may be formed in the region where metal lines are not disposed. An area of the spacer 270 may be less than an area of the exposed area of the insulating interlayer 260. Thus, the spacer 270 may be formed in an island shape. A height of the spacer 270 may be higher than a height of the pixel defining layer. The exposed area of the insulating interlayer 280 may be partially formed in the regions where metal lines are not disposed. Thus, the metal lines need not be exposed, so that the organic light emitting structures or the second electrode need not directly contact the metal lines. The spacer 290 may be formed on a remaining portion of a pixel defining layer on the metal lines through on the exposed area of the insulating interlayer 280. A height of the spacer 290 may be higher than a height of the pixel defining layer.

Figure 3:
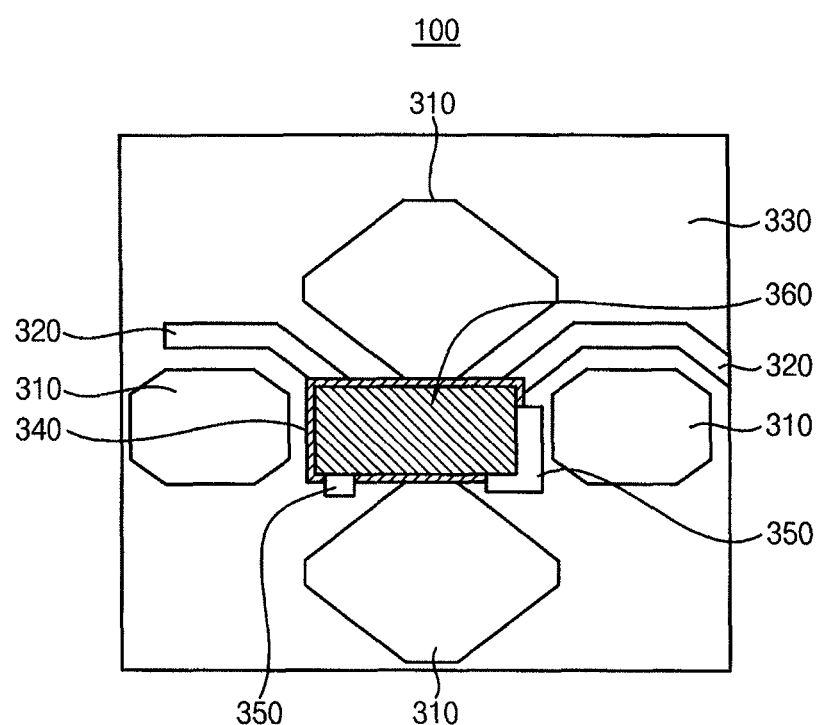
FIG. 3 illustrates a plan view of an example of a portion of the organic light emitting display panel of FIG. 1.

FIG. 3 illustrates a plan view of an example of a portion of the organic light emitting display panel of FIG. 1. A pixel defining layer 330 may define pixel regions 310 and non-pixel regions. Further, a remaining portion of the pixel defining layer 340 on a metal line 320 may be formed by a slit mask or a halftone mask. The exposed areas of the insulating interlayer 350, the pixel defining layer 340, and the spacer 360 may be simultaneously formed by using the slit mask or the halftone mask. A region of the pixel defining layer 340 may cover a portion of the metal line 320 so that organic light emitting structures or a second electrode need not directly contact to the metal line 320. The spacer 360 may be formed on the pixel defining layer 340 that is formed by the slit mask. Further, the exposed areas of the insulating interlayer 350 may be formed to be separate from the first electrode and the metal line 320. Thus, the spacer 360 may be on a region that is not used for the spacers in a comparative organic light emitting display panel. Therefore, an area ratio of the spacer to a unit pixel may increase.

Figure 4A:
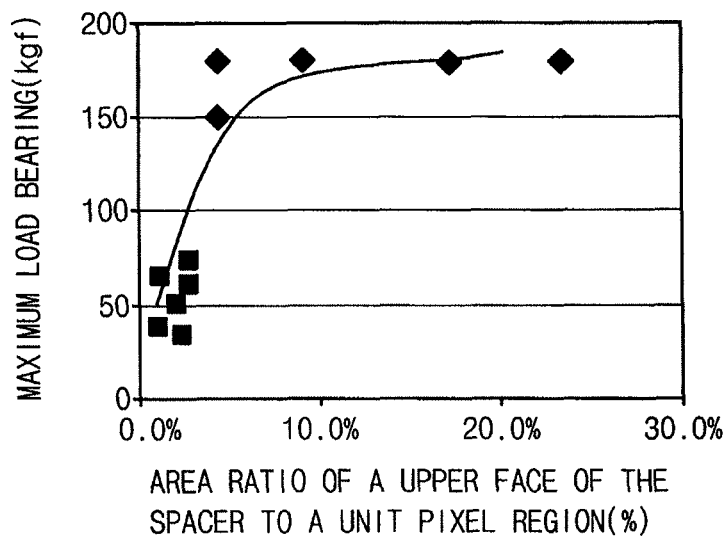
FIG. 4A is a graph of a relation between an area ratio of spacers and a maximum load-bearing of the organic light emitting display panel of FIG. 1.

FIG. 4A illustrates a graph of a relation between an area ratio of spacers and a maximum load-bearing of the organic light emitting display panel of FIG. 1. A horizontal axis of the graph indicates the area ratio of an upper face of the spacer to a unit pixel region, and a vertical axis of the graph indicates a maximum load-bearing of the organic light emitting display panel against an external force. As the area ratio of the upper face of the spacer to the unit pixel region increases, the organic light emitting display panel may withstand a heavy weight. Thus, structural stability of the organic light emitting display panel may be improved. The area ratio of the upper face of the spacer to the unit pixel region of a comparative structure (i.e., indicated as squares in FIG. 4A) is less than about 5%. Thus, a comparative organic light emitting display panel withstands only under 100 kgf. However, the area ratio of the upper face of the spacer to the unit pixel region of the organic light emitting display panel (i.e., indicated as rhombuses in FIG. 4A) may be greater than or equal to about 5%. Thus, the organic light emitting display panel may withstand more than or equal to about 150 kgf.

Figure 4B:
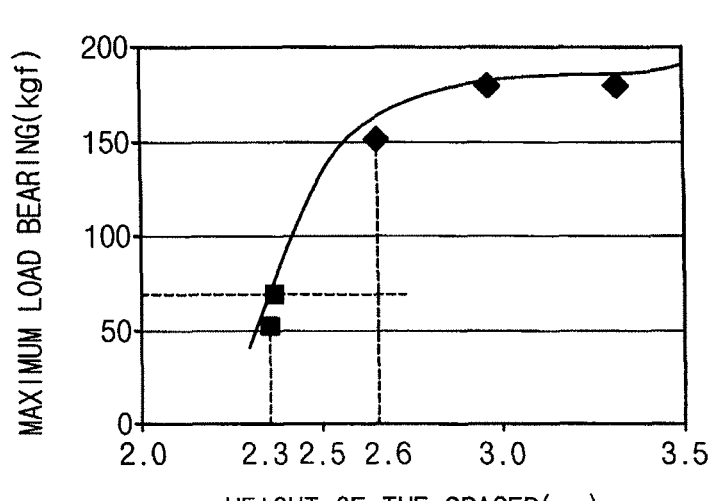
FIG. 4B is a graph of a relation between a height of spacers and a maximum load-bearing of the organic light emitting display panel of FIG. 1.

FIG. 4B illustrates a graph of a relation between a height of spacers and a maximum load-bearing of the organic light emitting display panel of FIG. 1. Referring to FIG. 4B, a horizontal axis of the graph indicates the height of the spacer, and a vertical axis of the graph indicates a maximum load-bearing of the organic light emitting display panel against an external force. As the height of the spacer increases, the organic light emitting display panel may withstand a heavy weight. Thus, structural stability of the organic light emitting display panel may be improved. The height of the spacer of the comparative structure (i.e., indicated as squares in FIG. 4B) is about 2.3 μm. Thus, the comparative organic light emitting display panel withstands only under 70 kgf. However, the height of the spacer of the organic light emitting display panel (i.e., indicated as rhombuses in FIG. 4B) may be greater than or equal to 2.6 μm up to 3 μm. Thus, the organic light emitting display panel may withstand more than or equal to 150 kgf. Thus, structural stability of the organic light emitting display panel may be improved more than two times than structural stability of the comparative organic light emitting display panel.

FIG. 5 illustrates a flow chart of a method of manufacturing an organic light emitting display panel according to the present disclosure. FIGS. 6A through 6E illustrate cross-sectional views illustrating the method of FIG. 5. Referring to FIG. 5, the method of FIG. 5 may form a plurality of thin film transistors on a substrate (S110), may form an insulating interlayer on the substrate to cover the thin film transistors (S120), may form a plurality of first electrodes and a plurality of metal lines on the insulating interlayer (S130), may deposit a photosensitive material layer on the first electrodes, the metal lines, and the insulating interlayer (S140), and may form a pixel defining layer on a portion of the insulation interlayer and an exposed area of the insulating interlayer by patterning the photosensitive material layer using a mask (S150). Subsequently, the method of FIG. 5 may form a plurality of organic light emitting structures on the first electrodes that are exposed by the patterning (S160), and may form a second electrode on the pixel defining layer, the exposed area of the insulating interlayer, and the organic light emitting structures (S170). At least one spacer may be formed on at least one of the pixel defining layer and the exposed areas of the insulating interlayer. At least one spacer may be formed on the insulating interlayer. The method of FIG. 5 may form a protection layer on the second electrode, may form an encapsulation substrate on the protection layer, and may encapsulate the organic light emitting display panel by using a sealing material.

Referring to FIG. 6A, the pixel defining layer may be formed on the portion of the insulation interlayer, and the exposed area of the insulating interlayer may be formed by patterning the photosensitive material layer 620 using a mask (S150). Specifically, the insulating interlayer 120 and the first electrodes 130 may be formed on the substrate 110, and then the photosensitive material layer 620 may be deposited on the insulating interlayer 120 and the first electrodes 130. The photosensitive material layer 620 may be patterned by lithography process using the mask to form the pixel defining layer, the exposed area of the insulating interlayer, and the spacer.

When, for example, the pixel defining layer is formed, the photosensitive material layer 620 may be patterned by exposing the photosensitive material layer 620 using a halftone mask 640. The exposed area of the insulating interlayer, the pixel defining layer, and the spacer may be simultaneously formed by the halftone mask 640. In example embodiments, the halftone mask 640 may include a transmissive region III, a light blocking region II, and semi-transmissive regions I. When, for example, the photosensitive material layer 620 may be formed using a positive photosensitive material. Thus, the semi-transmissive regions I may correspond to the pixel defining layer, the light blocking region II may correspond to the spacer, and the transmissive region III may correspond to the exposed first electrodes and the exposed area of the insulating interlayer.

Figure 6B:
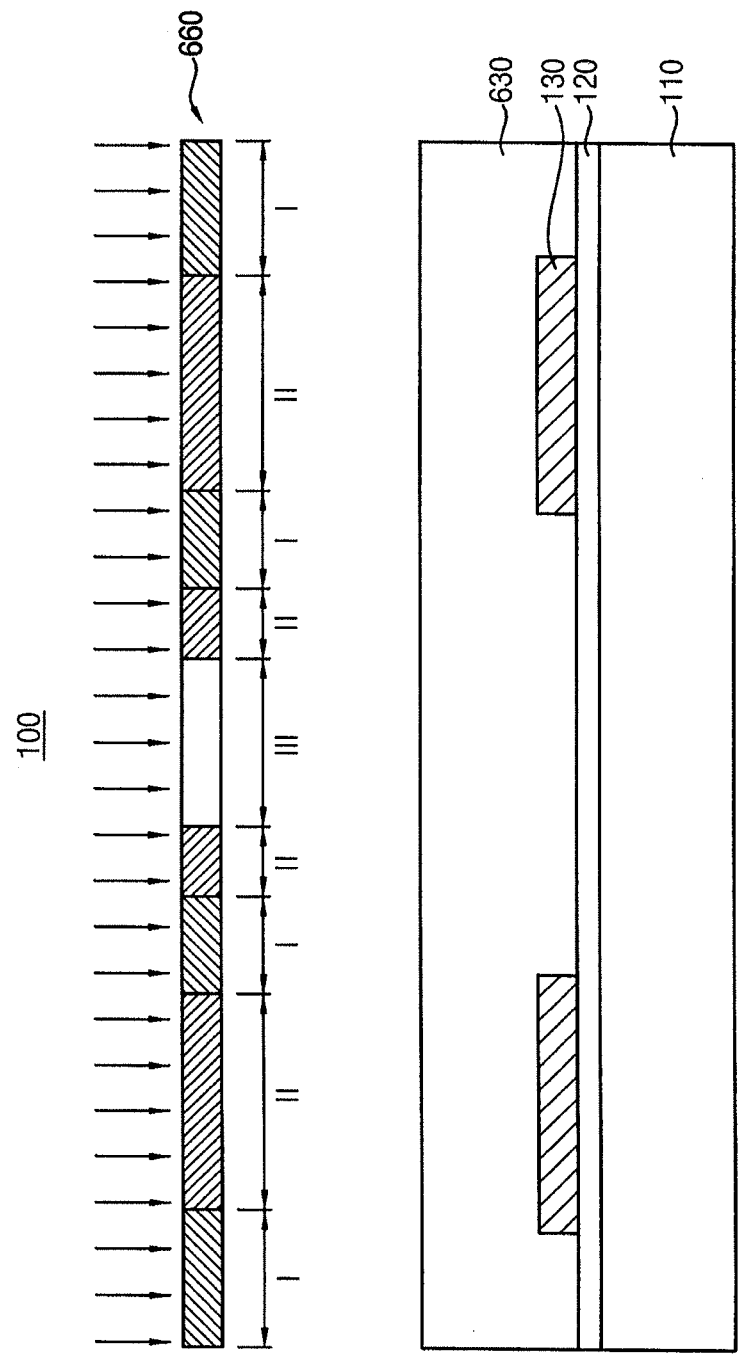

Referring to FIG. 6B, the photosensitive material layer 630 may be formed using a negative photosensitive material. Thus, the semi-transmissive regions I may correspond to the pixel defining layer, the transmissive region III may correspond to the spacer, and the light blocking region II may correspond to the exposed first electrodes and the exposed area of the insulating interlayer. A mask 660 may be used.

Figure 6C:
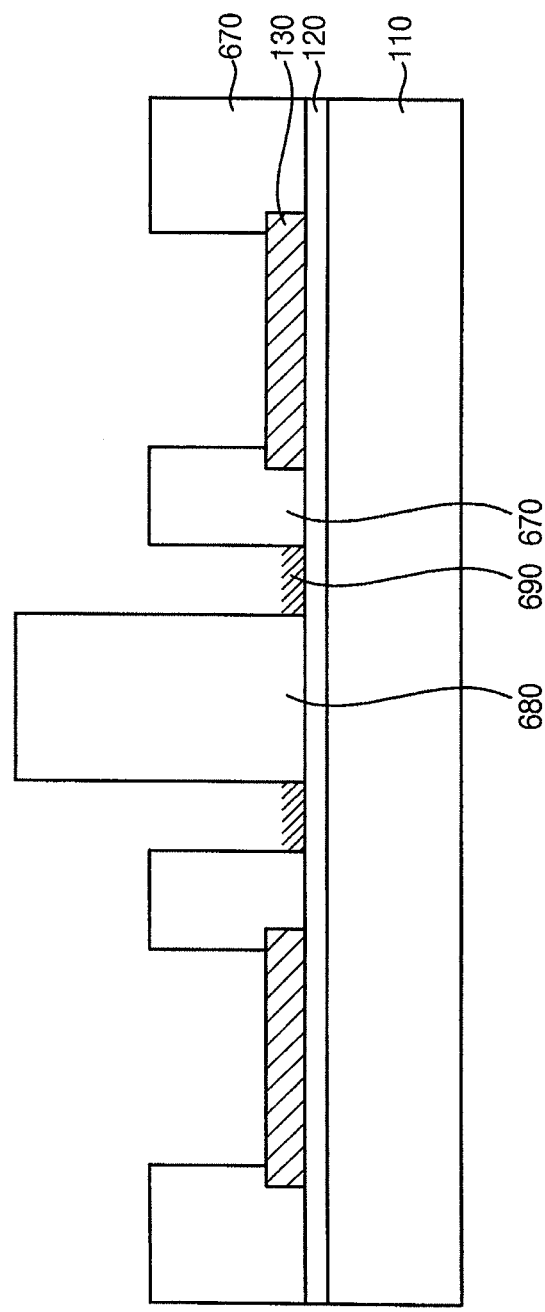

FIG. 6C illustrates a result of the mask process of FIG. 6A or FIG. 6B. The pixel defining layer 670, the spacer 680, and exposed area 690 of the insulating interlayer 120 may be simultaneously formed by the halftone mask. As illustrated in FIG. 6C, a height of the spacer 680 may be formed higher than a height of the pixel defining layer 670. The exposed area 690 of the insulating interlayer 120 may be formed between the spacer 680 and the pixel defining layer 670. Thus, the exposed area 690 of the insulating interlayer 120 may prevent the spacer 680 flowing onto a pixel region in a curing process by forming a space between the spacer 680 and the pixel defining layer 670.

The exposed area 690 of the insulating interlayer 120 may be between the separated first electrodes 130, and the spacer 680 may be on the exposed area 690 of the insulating interlayer 120 in an island shape. The spacer 680 may be on the insulating interlayer. A remaining portion of a pixel defining layer may be on a metal-line region by using a slit mask to cover the metal lines. The spacer may be formed over the remaining portion of the pixel defining layer and the exposed area of the insulating interlayer that is formed to be separate from the first electrode and the metal lines. Thus, the spacer may be on a region, for example, that is not used for the spacers in other organic light emitting display panels.

Figure 6D:
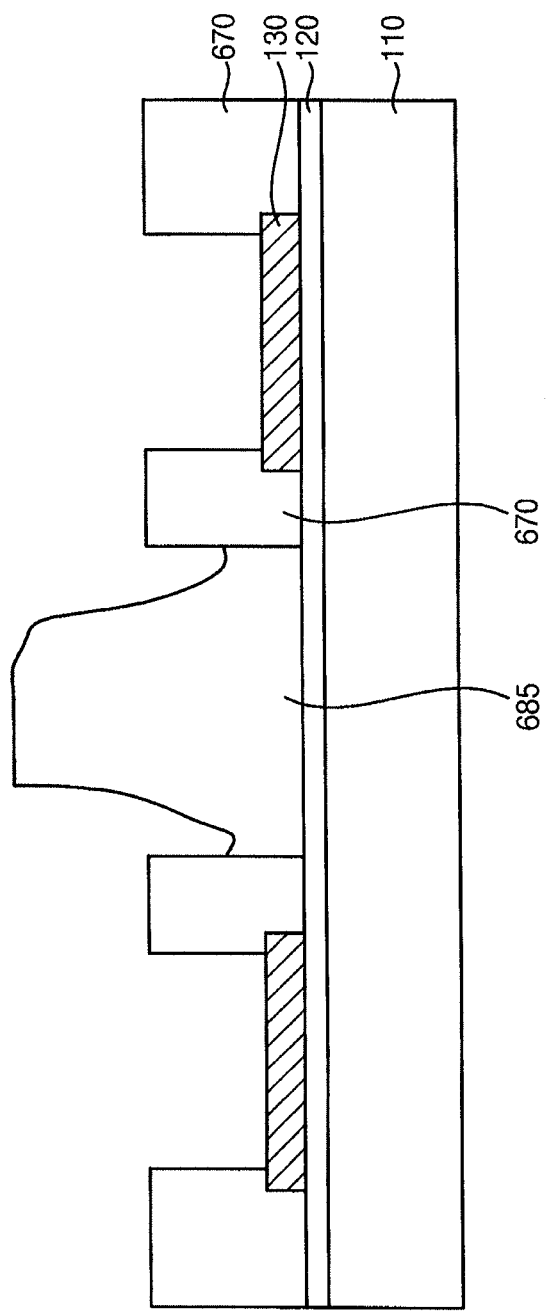

Referring to FIG. 6D, the spacer 685 may be reflowed in the curing process (or, baking process). The spacer and the pixel defining layer that are formed by a halftone mask may collapse in the curing process due to high temperature. According to the present disclosure, the spacer 685 and the side wall of the neighboring pixel defining layer may prevent the reflows, as the exposed area of the insulating interlayer is located between the spacer 685 and the pixel defining layer 670. As illustrated in FIG. 6D, even when the spacer is melted, the pixel defining layers 670 located on each side of the spacer 685 may act as a wall. Thus, the side of the neighboring pixel defining layer 670 may prevent the spacer 685 from flowing onto the pixel region. A certain level of height and area of the spacer (or, a predetermined level) may be maintained.

Figure 6E:
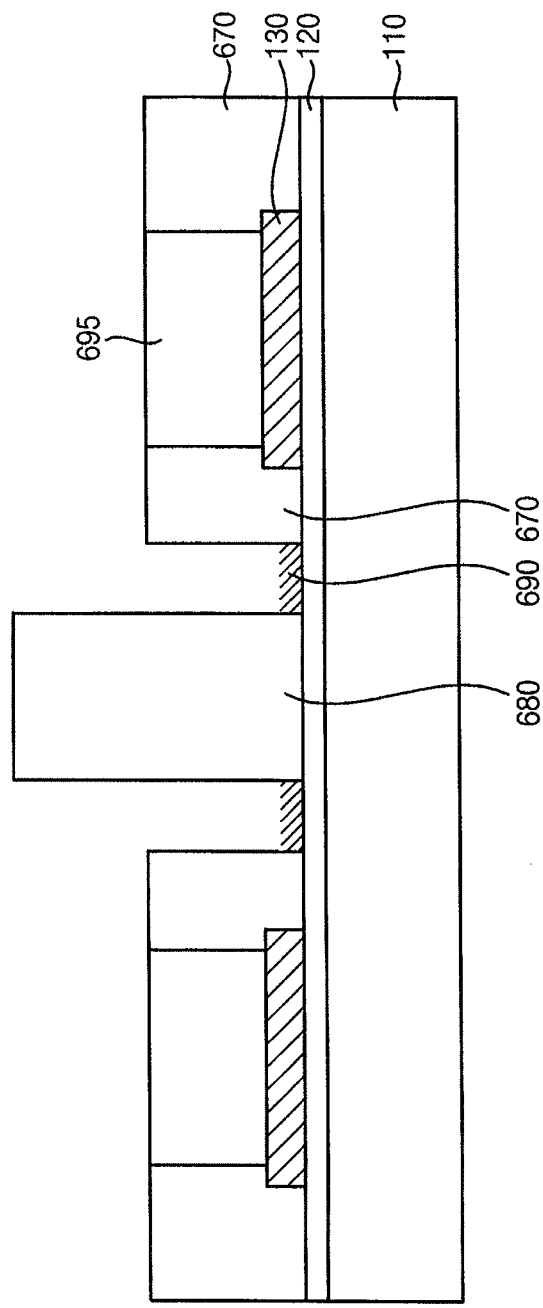

The organic light emitting structures 695 may be formed on the first electrodes 130 exposed by the patterning (S160). Referring to FIG. 6E, the organic light emitting structures 695 that emit one of red color light, green color light, and blue color light may be formed on the exposed first electrodes 130. The second electrode may be formed on the pixel defining layer 670, the exposed area 690 of the insulating interlayer 120, and the organic light emitting structures 695 (S170).

The organic light emitting display panel 100 may prevent the spacers from flowing onto the upper face of the pixel defining layer by having the spacers formed on the insulating interlayer. Thus, sufficient height and area of the spacer may be secured (e.g., a certain level of height and area of the spacer may be maintained). As a result, the spacer may ensure a predetermined gap between the substrate and the encapsulation substrate that is combined with the substrate. Even when pressure or stress is applied to the encapsulation substrate, the organic light emitting display panel 100 need not be damaged due to the spacer that ensures improved structural stability of the organic light emitting display panel 100.

The spacers may be formed on a region that is not used for the spacers in another manufacturing method by leaving a remaining portion of a pixel defining layer on a metal-line region by using a slit mask, while forming an exposed area of an insulating interlayer on a peripheral region of the metal-line region (i.e., by simultaneously forming the spacers and the exposed area of the insulating interlayer). An area ratio of spacer to a unit pixel may be increased. The organic light emitting display panel may ensure improved structural stability.

The present embodiments may be applied to any organic light emitting display panel including a spacer, and to any electronic device including the organic light emitting display panel. For example, the present embodiments may be applied to the electronic devices, such as a mobile phone, a smart phone, a laptop computer, a tablet computer, a personal digital assistants (PDA), a portable multimedia player (PMP), a digital camera, a music player, a portable game console, a navigation device, a television, a monitor, a lighting equipment, or the like.

By way of summation and review, an organic light emitting display panel may include a substrate having several layers, where the layers include a pixel defining layer (PDL) that defines a pixel region of the organic light emitting display panel. Further, an organic light emitting layer may be included in the organic light emitting display panel. The organic light emitting layer may be formed on the pixel region by using a fine metal mask (FMM). If a contact area of the mask that contacts the substrate including thin film transistors is relatively large, for example, the several layers may be damaged. Thus, the contact area of the mask may be reduced or minimized to prevent damage to the various layers. The organic light emitting display panel may include a spacer to ensure a predetermined gap between the substrate and the encapsulation substrate that is combined with the substrate. Further, the spacer may protect the various layers and a plurality of circuit elements in the organic light emitting display panel from pressure or stress.

After forming a pixel defining layer and a spacer, the spacer may flow or reflow onto the pixel defining layer in a curing process. This flowing of the spacer may result in the spacer failing to maintain a desired height and area. Thus, the spacer may not be able to prevent damage to various layers of an organic light emitting display panel.

As described herein, an organic light emitting display panel may dispense with additional steps for forming a spacer and an exposed area of an insulating interlayer by simultaneously forming the spacer, the exposed area of the insulating interlayer, and the pixel defining layer using a halftone mask. The spacer may be prevented from flowing onto an upper face of the pixel defining layer, and/or collapsing during a curing or baking process. Thus, the sufficiency of the height and area of a spacer may be maintained, and the spacer may ensure a predetermined gap between the substrate and the encapsulation substrate that is combined with the substrate. Even when pressure or stress is applied to the encapsulation substrate, the organic light emitting display panel may be protected from damage as the spacer helps ensure the structural stability of the organic light emitting display panel.

As also disclosed herein, a method of manufacturing an organic light emitting display panel may form spacers on a region that is not generally used for spacers by leaving a remaining portion of a pixel defining layer on a metal-line region by using a slit mask, and by forming the spacers while forming an exposed area of an insulating interlayer on a peripheral region of the metal-line region. For example, the spacers and the exposed area of the insulating interlayer may be simultaneously formed. Thus, sufficient height and area of the spacer may be maintained. Even when pressure or stress is applied to the encapsulation substrate, the organic light emitting display panel may be protected from damage as the spacer helps ensure improved structural stability of the organic light emitting display panel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An organic light emitting display panel, comprising:
   a plurality of thin film transistors on a substrate;
   an insulating interlayer on the thin film transistors, the insulation interlayer partially exposing electrodes of the thin film transistors;

a plurality of first electrodes on a portion of the insulating interlayer, the first electrodes being electrically connected to the thin film transistors;

a plurality of metal lines on a portion of the insulating interlayer;

a pixel defining layer on a portion of the insulating interlayer and a portion of the first electrodes, the pixel defining layer defining a pixel area by partially exposing the first electrodes, the pixel defining layer defining an exposed area of the insulating interlayer by partially exposing the insulating interlayer;

a plurality of organic light emitting structures on the first electrodes in the pixel area;

a second electrode on the organic light emitting structures; and a spacer on the pixel defining layer.

2. The panel as claimed in claim 1, wherein the exposed area of the insulating interlayer, the pixel defining layer, and the spacer are the result of a simultaneous formation using a halftone mask.

3. The panel as claimed in claim 2, wherein the pixel defining layer and the spacer include an identical material.

4. The panel as claimed in claim 2, wherein the pixel defining layer and the spacer include a photosensitive material.

5. The panel as claimed in claim 4, wherein the halftone mask includes a transmissive region, a blocking region, and semi-transmissive regions.

6. The panel as claimed in claim 5, wherein photosensitive material is formed using a positive photosensitive material, and the semi-transmissive regions correspond to the pixel defining layer, the light blocking region corresponds to the spacer, and the transmissive region corresponds to the exposed first electrodes and the exposed area of the insulating interlayer.

7. The panel as claimed in claim 5, wherein the photosensitive material is formed using a negative photosensitive material, and the semi-transmissive regions correspond to the pixel defining layer, the transmissive region corresponds to the spacer, and the light blocking region corresponds to the exposed first electrodes and the exposed area of the insulating interlayer.

8. The panel as claimed in claim 1, wherein the spacer is on the pixel defining layer, the pixel defining layer being patterned over the metal lines and the exposed area of the insulating interlayer by a slit mask.

9. The panel as claimed in claim 1, wherein the exposed area of the insulating interlayer is between the first electrodes, and the spacer is on the exposed area of the insulating interlayer in an island shape.

* * * * *